INVENTOR.
ALADDIN N. PERKINS
BY
Bean, Brooks, Buckley & Bean
ATTORNEYS

Jan. 24, 1967 A. N. PERKINS 3,300,707

POLYPHASE CRYSTAL-CONTROLLED MICROWAVE POWER SOURCE

Filed Oct. 7, 1963 2 Sheets-Sheet 2

INVENTOR.
ALADDIN N. PERKINS
BY
Bean, Brooks, Buckley + Bean
ATTORNEYS

United States Patent Office 3,300,707

Patented Jan. 24, 1967

3,300,707

POLYPHASE CRYSTAL-CONTROLLED MICROWAVE POWER SOURCE

Aladdin N. Perkins, Tucson, Ariz., assignor to Bell Aerospace Corporation, Wheatfield, N.Y.

Filed Oct. 7, 1963, Ser. No. 314,227

4 Claims. (Cl. 321—69)

This invention relates to microwave power sources and pertains, more particularly, to this type of power source wherein frequency multiplication using varactor diodes is employed.

Presently, microwave powerization by the use of a crystal-controlled oscillator operating in the HF, VHF, or low UHF range followed by solid state power amplifiers and several stages of frequency multiplication is coming into wide usage. One of the main reasons for the popularity for such devices is that they are driven by a crystal-controlled oscillator and thus display much less frequency drift and phase jitter than do systems employing klystrons and other sources. However, the present state of the art of solid state amplifiers is such as to seriously limit the power output which may be obtained with such a system. It is, therefore, of primary concern in connection with this invention to provide a crystal-controlled microwave power source exhibiting materially increased power output over contemporary crystal-controlled systems.

Further, it is an object of this invention to provide a crystal-controlled system of the type described in which the presence of spurious harmonics is eliminated so that both greater power output and less distortion is obtained than with contemporary crystal-controlled systems.

In general, the present invention is concerned with a microwave power generation system wherein M number of phases are produced from a single crystal-controlled source, the phases being displaced in equal increments so that a polyphase output from the single source is provided. Each of these outputs is applied to a solid state power amplifier and then subjected to an M times frequency multiplication whereafter the outputs of the frequency multipliers are applied to a common load which may be another polyphase system as described. In this fashion, much greater power output can be realized inasmuch as each phase is amplified by separate amplifying means and, with such a system, the polyphase outputs being in parallel, spurious harmonics are cancelled in the load.

Figure 1:
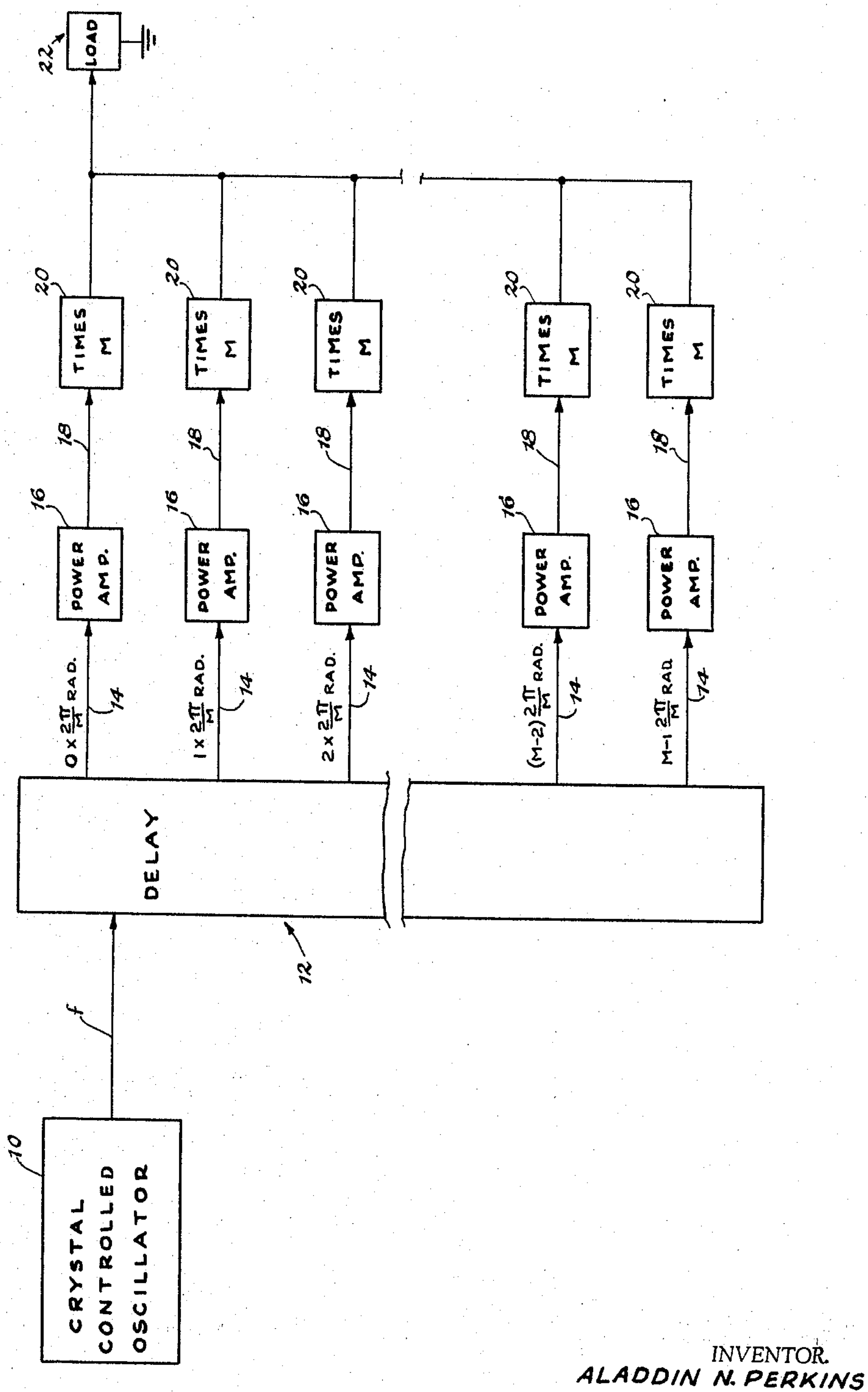
Figure 2:
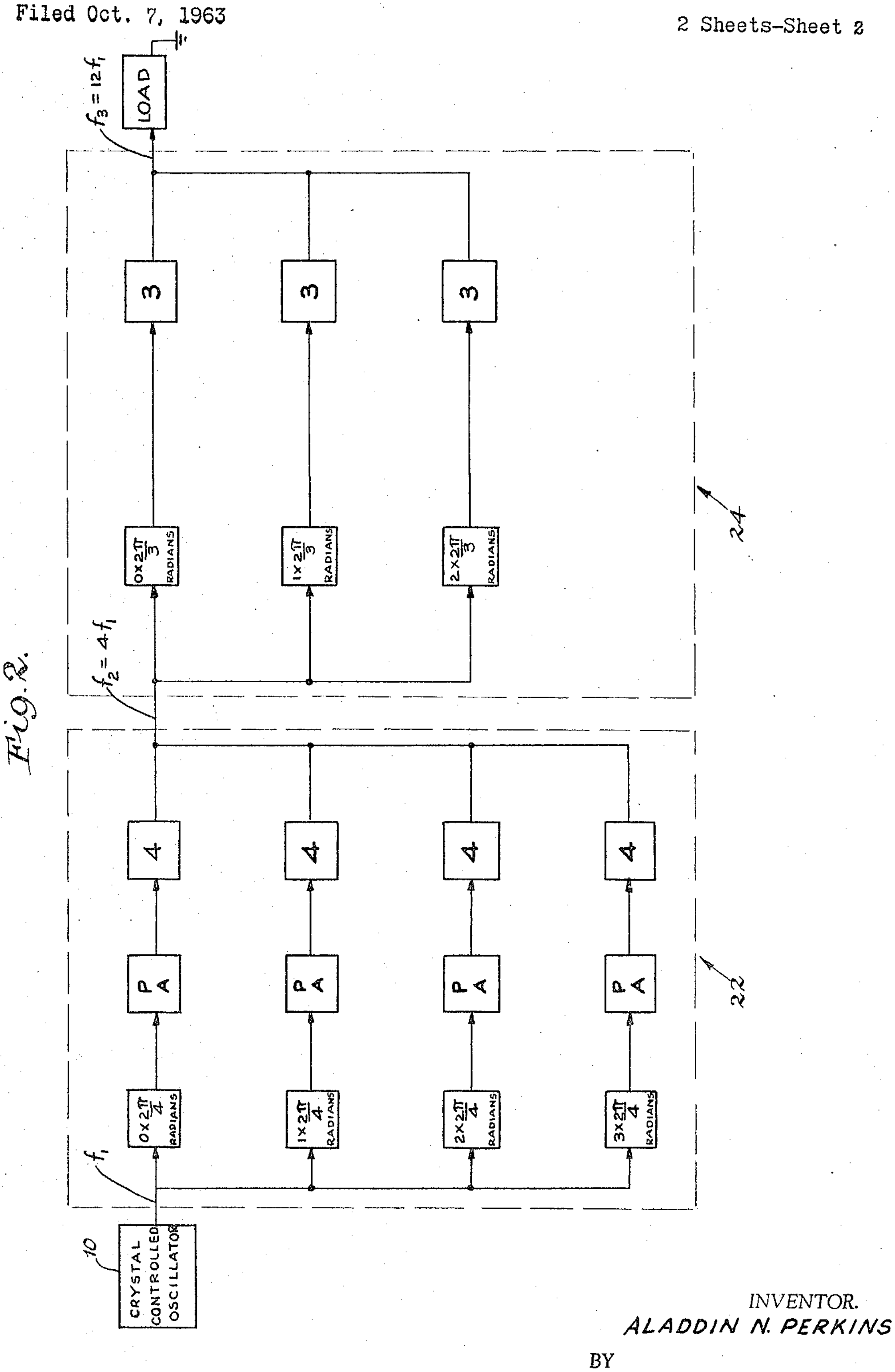

Other objects and advantages of the invention will appear from the description hereinbelow and the accompanying drawing wherein:

FIG. 1 is a block diagram illustrating the principles of the present invention; and FIG. 2 is a block diagram showing a representative system according to the present invention.

With reference now more particularly to FIG. 1, the system as shown therein will be seen to include a crystal-controlled oscillator 10 having an output at a frequency $f$ which is applied to a delay means indicated generally by the reference character 12. The delay means 12 is provided with a plurality of phase related outputs of a total number M, such outputs being indicated by the reference character 14 and, as indicated in FIG. 1, the phase angle difference between successive outputs 14 is equal to 2/M radians. These polyphase outputs are individually applied to solid state power amplifier means such as those indicated by reference character 16 and, after suitable amplification, the outputs at 18 are applied to individual frequency multiplier varactor diode means 20. The multiplication achieved in the multiplying means 20 is equal to the number of outputs of the delay means 12 so that when the outputs of the multiplying means 20 are applied commonly to a load indicated generally by the reference character 22, all harmonic currents will cancel in such load with the exception of the M$^{th}$ harmonic and whole number multiples thereof. Thus, very little distortion in the output fo the system may be expected. Furthermore, the over-all efficiency of the system is excellent and the output power is much greater than is obtained with conventional systems utilizing a crystal-controlled oscillator and varactor diode frequency multiplication.

As compared to microwave power generators utilizing klystrons and other sources, the present invention displays much less frequency drift and phase jitter. The crystal-controlled oscillator 10 operates at a suitable low frequency and sufficient multiplication is involved as to obtain the requisite microwave frequency. With such a system, a lightweight assembly may be provided, particularly adapted for airborne or space equipment. Thus, the frequency multiplier according to the present invention is particularly adapted to telemetry use, although not specifically limited theerto. Official Federal directors have ordered the present VHF telemetry bands to be vacated by 1970. The new bands allocated are in the L and S bands, 1435–1535 mc. and 2200–2300 mc. For airborne or space equipment, the required transmitters must be of solid state, so that they may be of lightweight and of compact size, present design considerations requiring that the weight of such transmitters not exceed about fifty pounds and to be contained in a volume of not in excess of 1,000 cubic inches while, at the same time, attaining good over-all power efficiencies greater than 2% and producing useful power output in the range of 10 to 50 watts. According to the present invention, the requisite power at L band frequency obtained from a 125 mc. crystal-controlled source is easily attained and, in addition, a similar arrangement can produce useful powers in the S band region.

In addition to the above, by virtue of the fact that spurious harmonic currents will cancel in the load, the output voltage waveform according to the present invention displays much less distortion than do contemporary systems utilizing solid state power amplifiers and, in general, the problems of filtering is much simplified in accordance with the present invention. Still further, tuning procedure for the system according to the present invention is relatively simple. The individual channels can be tuned separately as operating into loads equal to MR where R is the polyphase load. When all of the stages are tuned, they are parallel into the common load R and it has been found that only a small amount of retuning will be required.

The required delay means can be synthesized with lump circuit elements in the lower frequency regions whereas at higher frequencies, the use of distributed parameter delay lines is required.

An illustrative embodiment of the present invention is shown in FIG. 2 wherein it will be seen that the output of the first polyphase frequency multiplier 22 is applied to a second polyphase frequency multiplier 24. FIG. 2 illustrates that the frequency multiplication in each of the successive multipliers need not be the same. In the particular instance shown, the first multiplier 22 produces a frequency $f_2$ equal to four times the oscillator frequency $f_1$. In the second frequency multiplying means 24, frequency multiplication by a factor of 3 is obtained so that the output $f_3$ is equal to twelve times the original frequency $f_1$. Obviously, additional frequency multiplication can be obtained if so desired, the only limiting factors being the frequency of the source 10 and the desired frequency at the output.

In accordance with the above, it will be readily appreciated that the present invention achieves several objectives simultaneously. First of all, a much greater power output as compared with contemporary solid state power amplifier systems can be obtained. Actual comparisons indicate that the present invention is capable of producing a power output increase in the microwave frequency region of about a factor of 10. Further, the present invention obtains cancellation of spurious harmonics so as to simplify the filtering requirements for the system as compared to contemporary systems, and, in addition, less distortion in the output voltage waveform is obtained according to the practice of the present invention.

It is to be understood that certain changes and modifications as illustrated and described may be made without departing from the spirit of the invention or the scope of the following claims.

I claim:

1. In a microwave power source, in combination,
a crystal-controlled oscillator having a low frequency output,
delay means connected to the output of said oscillator and having N outputs in which the phase angles of successive outputs differ by $2\pi/N$ radians,
power amplifier means connected to each output of said delay means,
frequency multiplier means connected to the output of each amplifier means and each such amplifier means having an output N times the frequency of said oscillator,
and load means to which the outputs of said multiplier means are commonly connected.

2. In a microwave power source, in combination,
a crystal-controlled oscillator having a low frequency output,
first polyphase power amplification means connected to the output of said oscillator and having N outputs in which each output is at a frequency N times the frequency output of said oscillator,
second polyphase power amplification means having said N outputs as a common input thereto with such second means having M outputs in which each output is at a frequency $M \times N$ times the frequency output of said oscillator.

3. In the method of providing high power output energy at a microwave frequency from a crystal-controlled source of lower frequency, the steps of:
producing N phase-related components of said source frequency, in which successive components differ in phase angle by $2\pi/N$ radians,
individually amplifying the phase-related components,
multiplying the frequency of each amplified component by the factor N,
and applying the so-obtained amplified frequency-multiplied components to a common load to cancel all harmonics except the $N^{th}$ and whole number multiples thereof.

4. A microwave power source comprising, in combination,
a crystal controlled oscillator having an output of relatively low frequency as compared to the microwave frequency desired,
a plurality of polyphase frequency multipliers connected in series with the output of said oscillator for generating the desired microwave frequency,
each of said frequency multipliers including delay line means having a plurality of phase-related outputs, solid-state amplifier means for each of such outputs, and varactor diode frequency multiplication means for each amplifier means output, in which the factor of frequency multiplication is equal to the number of said phase-related outputs, and in which the input of successive polyphase frequency multipliers is the outputs of the frequency multiplier means of the preceding polyphase frequency multiplier.

No references cited.

JOHN F. COUCH, *Primary Examiner.*

G. GOLDBERG, *Assistant Examiner.*